Sept. 13, 1960 L. E. MILLER 2,952,816
LIMITING AMPLIFIER
Filed Oct. 21, 1955
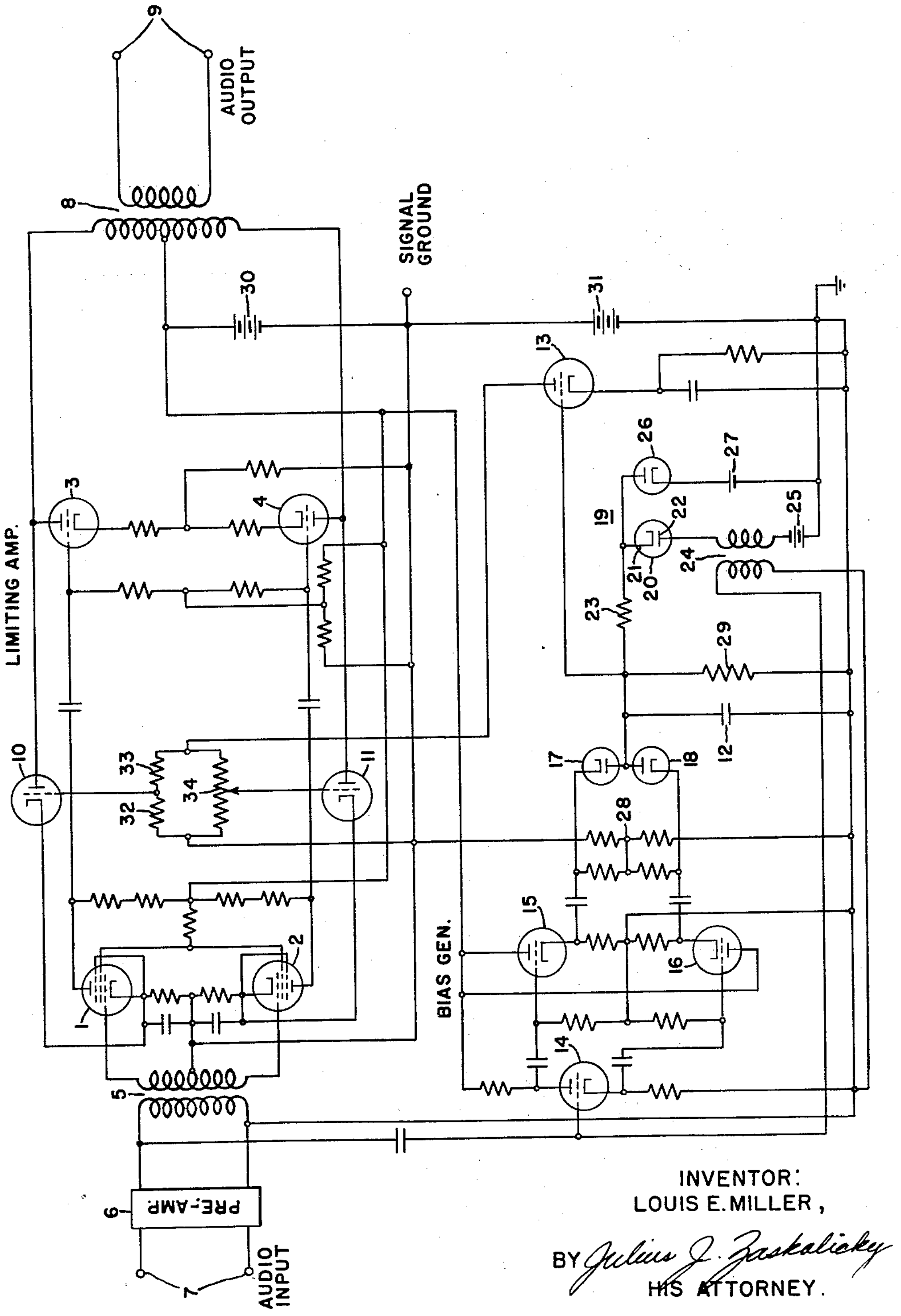
INVENTOR:
LOUIS E. MILLER,
BY Julius J. Zaskalicky
HIS ATTORNEY.

United States Patent Office 2,952,816
Patented Sept. 13, 1960

2,952,816
LIMITING AMPLIFIER

Louis E. Miller, Liverpool, N.Y., assignor to General Electric Company, a corporation of New York Filed Oct. 21, 1955, Ser. No. 542,040
5 Claims. (Cl. 330—135)

The present invention is directed to amplifiers in general and has as an object thereof to provide improvements in limiting amplifiers.

Limiting amplifiers find extensive application in limiting the amplitude of an audio signal prior to the application thereof to a transmitter to avoid over modulation of the transmitter. Such a limiting amplifier usually includes a circuit for rectifying the applied signal and applying the rectified signal to the amplifier to vary the gain of the amplifier in inverse relationship to the amplitude of the signal. Such a circuit usually includes a rectifier and a resistance-capacitance network in the load circuit of the rectifier. In the operation of such a circuit, the capacitance is charged to a large potential on peaks of applied signal thereby appreciably reducing the gain of the amplifier; consequently, should there be an appreciable wait period after the application of other signals, the gain of the amplifier is caused to return to full value, thereby greatly increasing background noise from the output of the amplifier. Occurrence of such signals results in a periodic rise of background noise or low level program material giving rise to an effect commonly called "pumping." Also, if the time constant of the resistance-capacitance network of the above rectifier circuit is made sufficiently large to reduce the aforementioned effects, the program level is excessively depressed.

The present invention is directed to the elimination of such limitations in prior art arrangements.

Another object of the present invention is to provide a simple and effective circuit for returning a limiting amplifier to normal gain only during signal intervals thereby avoiding the adverse effects of increasing gain during the absence of useful signal.

Still another object of the present invention is to provide a limiter circuit in which the recovery of the gain thereof is at a controlled rate in response to reception of signals of smaller amplitude than the signal which initially caused a depresseion of gain.

In carrying out applicant's invention in one form, a means is provided responsive to amplitudes of audio signals greater than a predetermined amplitude for developing a potential to reduce the gain of the amplifier and to maintain the amplitude of the output of said amplifier less than a second predetermined amplitude. Further means are provided for maintaining the gain of said amplifier at said value for an appreciable time after the disappearance of the signal causing said reduction in gain. Still further means are provided in response to subsequent signals of an amplitude greater than a third predetermined amplitude, for increasing the gain at a predetermined rate during the occurrence of said subsequent signals.

The novel features which are considered to be characteristic of my invention are set forth with particularity in the appended claims. The invention itself, however, both as to its organization and method of operation together with further objects and advantages thereof may be best understood with reference to the following description taken in connection with the accompanying drawing of a schematic diagram of an embodiment of the present invention.

Referring now to the drawing, there is shown an embodiment of the present invention. The limiting amplifier therein shown comprises an input stage including a pair of electron discharge amplifiers 1 and 2 connected in push-pull relationship and an output stage including electron discharge amplifiers 3 and 4. Amplifiers 1 and 2 are driven by a transformer 5 which in turn is driven by a preamplifier of conventional design 6 having its input connected to a pair of input terminals 7. Output from amplifiers 3 and 4 is applied to output transformer 8, the output of which is supplied to output terminals 9. The gain of the limiting amplifier is controlled by devices 10 and 11 connected in degenerative feed-back loops from amplifier 1 to amplifier 3 and from amplifier 2 to amplifier 4, respectively.

Application of suitable potentials to the grids of devices 10 and 11 controls the amount of negative feed-back from the output stage 3 and 4 to the input stage 1 and 2, thereby controlling the gain of the limiting amplifier. The potential utilized for this purpose is obtained across a capacitance 12. The unidirectional potential appearing on capacitance 12 is applied through a D.-C. amplifier 13 to the grids of devices 10 and 11.

The unidirectional potential appearing across capacitance 12 is obtained by rectification of the input signal after it has been suitably amplified by a bias generator including phase splitting device 14 and a pair of push-pull cathode follower devices 15 and 16. The phase splitting device is connected to the output of the preamplifier 6. The output of the phase splitter 14 drives the cathode follower stages 15 and 16 in push-pull. The output from the latter stages are rectified by unilaterally conducting devices 17 and 18, respectively. In the absence of any additional circuitry other than that described in the above paragraphs the undesirable effects mentioned above, that is, pumping, the presence of background noise and the reduction of average output level are experienced. This invention is directed to elimination of such adverse effects. Circuit 19 is directed to this end.

Circuit 19 includes a unilaterally conducting device 20 having a cathode 21 and an anode 22. Cathode 21 is connected through a large resistance 23 to the ungrounded electrode of capacitance 12, which is connected to the rectifiers 17 and 18 in such a manner that only negative potentials with respect to ground are developed on this electrode. The anode 22 of device 21 is connected through the secondary of transformer 24 to the negative terminal of a bias source 25, the positive terminal of which is connected to ground. The primary of transformer 24 is connected to the audio input of the limiting amplifier and is conveniently shown as connected to the output of the preamplifier 6. Connected in shunt with the unilaterally conducting device 20 is another unilaterally conducting device 26 with its anode connected to the cathode of device 21 and its cathode connected to the positive terminal of unidirectional bias source 27, the negative terminal of which is connected to ground. The device 26 functions to limit the rate of gain recovery of the limiting amplifier to a value determined by bias source 27, as will be further explained below.

The operation of applicant's circuit will best be explained by considering a specific example. Let it be assumed that the bias at the point 28 is arranged such that diodes 17 and 18 do not conduct for peak values of applied audio signals less than 2 volts. Let it further be assumed that the time constant comprising capacitance 12 and resistance 29 is of the order of a minute or larger and the time constant of the combination comprising capacitance 12 and resistance 23 and diode 20 is of the order of 5 seconds. Let it further be assumed that anode of device 20 is biased through transformer 24 by source 25 to a potential of approximately 11 volts negative and the cathode of device 26 is biased 4 volts positive.

Signals applied to the limiting amplifier of less than 2 volts are unaffected. Signals of greater than 2 volts peak are rectified by the bias amplifier arrangement and cause a corresponding voltage to appear across capacitance 12. The unidirectional voltage across capacitance 12 is applied through the D.-C. amplifier 13 to the limiting amplifier to vary the gain thereof and thereby limit the output appearing at output terminals 9.

Let it be assumed that the magnitude of audio voltage applied to the circuit is approximately 11 volts, and thereafter the signal voltage is substantially zero. If no other audio signal is applied for about a minute, the charge on capacitance 12 will decrease somewhat through resistance 29 and thereby tend to restore the amplifier to its normal gain. Over the space of a few seconds, however, the voltage on capacitance 12 will not change. During this time the voltage on the cathode 21 and the anode 22 are approximately at 11 volts and the decay of voltage will be through the resistance 29. If during this period of time there is some audio signal coming through in a standard type of communication, this audio signal will be applied through the transformer 24 to the anode 22 causing for a portion of the audio cycle the anode 22 to be positive with respect to the cathode 21, thereby rendering the device 20 conductive and permitting the charge on the capacitance 12 to decay at a rate determined by the time constant of this circuit and the program material, i.e., its duration and amplitude. Thus, the magnitude of the voltage on the capacitance 12 and hence the gain of the amplifier is caused to change only during signal intervals, during which time the change in gain is not noticeable, especially in view of the fact that the time constant is chosen so that the increase in gain is gradual.

The function of the device 26 is to limit the rate of decrease of charge on large amplitude signals applied to the diode 21. When the amplitude of this signal exceeds a value such as to render the cathode 21 more positive than the 4-volt bias applied to the cathode device 26, this device conducts and limits the cathode excursion to the four volts. This circuit avoids a very sudden return of the gain of the amplifier to a new normal value as determined by the subsequent signal applied to the amplifier.

Referring now to the limiting amplifier in more detail, the preamplifier 6 may comprise any of a variety of audio-amplifiers, the function of which is to increase the amplitude of the applied signal up to a value suitable for application to the limiting amplifier and may be omitted if signals of sufficient amplitude are otherwise available. The transformer 5 is a conventional coupling transformer for coupling the output of the limiting amplifier 6 to the input of the devices 1 and 2. The secondary of the transformers are center tapped to signal ground, the other ends of which are connected to grids to devices 1 and 2 to drive these devices in push-pull relationship. The cathode devices 1 and 2 are connected to signal ground through suitable biasing networks. The screen grids of these devices are tied together and are connected through a screen load resistance to the positive terminal of the source of unidirectional potential 30. The anodes of the devices are connected through respective anode load resistances to the positive terminal of the source 30 of unidirectional potential. The anodes of devices 1 and 2 are also connected through coupling capacitances to the grids of devices 3 and 4, respectively. The anodes of devices 3 and 4 are connected to the ends of the primary of transformer 8, the center tap of which is connected to the positive terminal of source 30. The secondary of the transformer is connected to the output terminals 9. Cathodes of devices 3 and 4 are connected through cathode resistances to negative terminal of source 30. The grids of devices 3 and 4 are connected through grid resistances to a bias potential point.

The anode of device 3 is connected to the anode of electron discharge device 10, the cathode of which is connected to the cathode of device 1. Similarly, the anode of device 4 is connected to the anode of device 11, the cathode of which is connected to the cathode of device 2. The grid of device 10 is connected to the junction of resistances 32 and 33 which are connected in series between signal ground and the device 13. Similarly, the grid of device 11 is connected to a variable tap on resistance 34 which is connected between signal ground and the anode of D.-C. amplifier 13. The cathode of D.-C. amplifier 13 is connected through a biasing network to the negative terminal of a source of a unidirectional potential 31, the positive terminal of which is connected to signal ground. The grid of device 13 is connected to one electrode of capacitance 12, the other electrode of which is connected to the negative terminal of source 31.

The output of preamplifier 6 is coupled to the grid of the device 14 which includes a cathode connected through a cathode resistance to the negative terminal of source 31, and an anode connected through an anode load resistance to the positive terminal of source 30. An output of one phase appears across the cathode resistance and an output of an opposite phase appears across the anode resistance. These outputs are coupled to the push-pull cathode follower devices 15 and 16 across respective cathode resistances of which push-pull outputs are obtained. The cathode of device 15 is capacitively coupled to the cathode of unilaterally conducted device 17. Similarly, the cathode of device 16 is capacitively coupled to the cathode of unilaterally conducting device 18. The cathodes of devices 17 and 18 are connected through respective resistances to a bias point 28 such that only voltages exceeding a predetermined value are passed by rectifiers 17 and 18 to charge capacitance 12. The anodes of rectifiers 17 and 18 are connected to the ungrounded end of capacitance 12. The aforementioned predetermined value determines the threshold value below which no limiting value takes place and above which limiting action takes place to limit the output of the amplifier to less than a predetermined amplitude of output.

While a particular embodiment of my invention has been shown and described, it is apparent that changes and modifications may be made without departing from the invention in its broader aspects and, therefore, the aim in the appended claims is to cover all such changes and modifications which fall within the true spirit and scope of my invention.

What I claim as new and desire to secure by Letters Patent of the United States is:

1. In combination, in an amplifier for amplifying audio signals, the amplitudes of which vary over a wide range of amplitudes, means for applying said signals to a circuit including a unilaterally conducting device and a capacitance connected in series, means for applying the potential developed across said capacitance to vary the gain of said amplifier in inverse relation to the magnitude of said potential, resistance means, a second unilaterally conducting device connected in shunt with said capacitance through said resistance means, said second device being poled to be conductive by voltages developed across said capacitance and being biased nonconductive except for voltages greater than a predetermined voltage developed across said capacitance, means for rendering said second device conductive in response to said signals greater than a predetermined amplitude and only during the occurrence of said signals, thereby discharging said capacitance only during the occurrence of said signals.

2. In combination, in an amplifier for amplifying audio signals, the amplitudes of which vary over a wide range of amplitudes, means for applying said signals to a circuit including a unilaterally conducting device and a capacitance connected in series, said capacitance being shunted by a first resistance, means for applying the potential developed across said capacitance to vary the gain of said amplifier in inverse relation to the magnitude of said potential, a second unilaterally conducting device connected in shunt with said capacitance through a second resistance, said second device being poled to be conductive by voltages developed across said capacitance and being biased nonconductive except for voltages greater than a predetermined voltage developed across said capacitance, means for rendering said second device conductive in response to said signals greater than a predetermined amplitude and only during the occurrence of said signals, thereby discharging said capacitance only during the occurrence of said signals.

3. In combination, in an amplifier for amplifying audio signals, the amplitudes of which vary over a wide range of amplitudes, means for applying said signals to a circuit including a unilaterally conducting device and a capacitance connected in series, said capacitance being shunted by a resistance, means for applying the potential developed across said capacitance to vary the gain of said amplifier in inverse relation to the magnitude of said potential, a second unilaterally conducting device connected in shunt with said capacitance through a second resistance, said second device being poled to be conductive by voltages developed across said capacitance and being biased nonconductive except for voltages greater than a predetermined voltage developed across said capacitance, means for rendering said second device conductive in response to said signals greater than a predetermined amplitude and only during the occurrence of said signals, thereby discharging said capacitance only during the occurrence of said signals, means for limiting the rate of current flow through said second unilaterally conducting device.

4. In combination, in an amplifier for amplifying audio signals, the amplitudes of which vary over a wide range of amplitudes, means for applying said signals to a circuit including a unilaterally conducting device and a capacitance connected in series, said capacitance being shunted by a resistance to form a first discharge circuit for said capacitance, means for applying the potential developed across said capacitance to vary the gain of said amplifier in inverse relation to the magnitude of said potential, a second unilaterally conducting device connected in shunt with said capacitance through a second resistance to form a second discharge circuit for said capacitance, said second device being poled to be conductive by voltages developed across said capacitance and being biased nonconductive except voltages greater than a predetermined voltage developed across said capacitance, means for rendering said second device conductive in response to said signals greater than a predetermined amplitude and only during the occurrence of said signals, thereby discharging said capacitance only during the occurrence of said signals, the time constant of said first mentioned discharge circuit being substantially longer than the duration of normal audio pauses and the time constant of said second mentioned discharge circuit for said capacitance being substantially shorter than the time constant of said first mentioned discharge circuit.

5. In combination, in an amplifier for amplifying audio signals, the amplitudes of which vary over a wide range of amplitudes, means for applying said signals to a circuit including a unilaterally conducting device and a capacitance connected in series, said capacitance being shunted by a resistance, means for applying negatively the potential developed across said capacitance to vary the gain of said amplifier in inverse relation to the magnitude of said potential, a second unilaterally conducting device connected in shunt with said capacitance through a second resistance, said second device being poled to be rendered conductive by voltages developed across said capacitance and being biased nonconductive except for voltages greater than a predetermined voltage developed across said capacitance, means for rendering said second device conductive in response to signals greater than a predetermined amplitude and only during the occurrence of said signals, thereby discharging said capacitance only during the occurrence of said signals, and a third unilaterally conducting device connected in shunt with said second device and biased to limit the positive excursion of the junction of said first device and first resistance to a predetermined potential.

References Cited in the file of this patent

UNITED STATES PATENTS

| | | |
|---|---|---|
| 2,156,846 | Getaz | May 2, 1939 |
| 2,250,559 | Weber | July 29, 1941 |
| 2,263,165 | Dallos | Nov. 18, 1941 |
| 2,272,788 | Bishop | Feb. 10, 1942 |
| 2,369,066 | Maxwell | Feb. 6, 1945 |
| 2,497,691 | Schroeder | Feb. 14, 1950 |
| 2,515,196 | Coe | July 18, 1950 |
| 2,544,340 | Maxwell | Mar. 6, 1951 |
| 2,594,807 | Ross | Apr. 29, 1952 |
| 2,615,999 | Culcietto | Oct. 28, 1952 |
| 2,750,451 | Crow | June 12, 1956 |

FOREIGN PATENTS

| | | |
|---|---|---|
| 61,990 | Denmark | Feb. 21, 1944 |